(12) United States Patent
Sohn

(10) Patent No.: US 6,690,021 B2
(45) Date of Patent: Feb. 10, 2004

(54) METHOD OF ALIGNING A WAFER IN A PHOTOLITHOGRAPHY PROCESS

(75) Inventor: Taek-Soo Sohn, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/163,358

(22) Filed: Jun. 7, 2002

(65) Prior Publication Data

US 2003/0102440 A1 Jun. 5, 2003

(30) Foreign Application Priority Data

Dec. 3, 2001 (KR) ........................................ 2001-75814

(51) Int. Cl.[7] .............................................. G01N 21/86
(52) U.S. Cl. ................ 250/492.1; 250/491.1; 250/492.2
(58) Field of Search .......................... 250/491.1, 492.1, 250/492.2, 492.21, 492.22, 492.3

(56) References Cited

U.S. PATENT DOCUMENTS

| | | | |
|---|---|---|---|
| 5,783,833 A | * | 7/1998 | Sugaya et al. ............... 250/548 |
| 5,834,785 A | | 11/1998 | Coon |
| 5,847,959 A | | 12/1998 | Veneklasen et al. |
| 6,087,053 A | | 7/2000 | Hara |

* cited by examiner

*Primary Examiner*—John R. Lee
*Assistant Examiner*—David A. Vanore
(74) *Attorney, Agent, or Firm*—Volentine Francos, PLLC

(57) ABSTRACT

A method of aligning a wafer for a photolithography process includes establishing a database that includes alignment position data related to the contraction or expansion of a wafer and correcting the data with a compensation value drawn from various specifications of the wafer. The method occurs during a re-alignment of the wafer when measurements indicative of the degree of misalignment of the wafer are outside a prescribed margin for error. The compensation values pertain to the relationship between the step heights of alignment marks formed on the wafers and deposition layers extending over the alignment marks. During the expansion or contraction of the wafer, the deposition layer becomes asymmetrical. The compensation values are a measure of this asymmetry, and hence, are a measure of the discrepancy between the actual position of the alignment mark and the sensed position. By taking into account the step height of the alignment mark and the effect it may have on the sensing of the alignment mark position upon thermal expansion or contraction of the wafer, fewer wafers will be improperly judged as requiring re-working. Hence, the productivity and job efficiency of the photolithography process as well as the quality and reliability of a final product are improved.

12 Claims, 5 Drawing Sheets

METHOD OF ALIGNING A WAFER IN A PHOTOLITHOGRAPHY PROCESS

BACKGROUND OF THE INVENTION

1. Field of the Invention

The present invention relates to photolithography. More particularly, the present invention relates to a method of aligning pattern images transcribed onto wafers for producing circuit patterns on the wafers.

2. Description of the Related Art

In general, a plurality of different images must be formed on a wafer to fabricate the circuit pattern of a semiconductor device. Photolithography is the process used to produce these images on the wafer. In photolithography, pattern images are defined on a plurality of reticles. The pattern images are sequentially transcribed from the reticles onto the wafer, i.e., are overlayed. This overlay step, along with etching, deposition and other processing steps, form the desired circuit pattern.

Obviously, a highly precise and densely integrated circuit pattern can be produced only if the different pattern layers forming the circuit pattern, i.e., the pattern images, are accurately aligned or overlayed relative to one another. Therefore, the absolute purpose of the overlay step is to produce a pattern layer that is as precisely aligned as possible with a pre-existing pattern layer. Efforts aimed at achieving a highly precise overlay of pattern layers using photolithography have concentrated on the design of the pattern images of the reticles and the composition of the photoresist. However, there are a number of restrictions to improving these aspects of photolithography.

The (critical) dimension of the patterns is usually limited by the specifications of the photolithography equipment and the nature of the photoresist. However, the accuracy in aligning the pattern images can be maintained or improved by periodical preventative maintenance of the photolithography equipment and continuous development of measurement tools. With respect to the latter, the extent to which overlayed pattern layers are aligned is measured and results of these measurements are incorporated into a standard database. The database is used to determine whether another operational step, such a photoresist developing step, should follow or whether the photolithography equipment requires maintenance or the wafer requires re-alignment to compensate for factors causing a misalignment of the sequentially formed pattern layers.

A standard database should suffice for achieving a precise overlay of pattern layers. However, this is not always the case because different alignment marks have been used as a standard reference for the transcribing of pattern images. Furthermore, different equipment may produce different overlay detection results even with the same type of alignment mark. Most of all, however, a reference database put together in this way may not suffice to ensure that a proper alignment between pattern layers is taking place because the make-up of the data includes both linear and non-linear parameters.

More specifically, the linear parameters include the extent to which the pattern images transcribed onto the pre-existing patterns of a wafer are misaligned in X axis and Y axis directions, the amount that a pattern layer has contracted or expanded from its center, a deviation of the relative rotational or angular position of the pattern and the like. The non-linear parameters include the degree of misalignment of a pre-existing pattern, the degree of precision of the alignment marks themselves, an error in the measurement equipment and the like. The linear and non-linear parameters must be discriminated so that the results can be properly analyzed.

According to the conventional art in which the data accumulated includes both linear and non-linear parameters, measurements indicative of the state of the overlay of pattern images are taken from respective shots (or dies) of the wafer or a plurality of alignment marks distributed over the wafer.

The conventional photolithography process will now be described with reference to FIGS. 1–4. As shown in FIG. 1, first, a wafer coated with photoresist is loaded into the photolithography processing equipment, as faced towards a reticle from which pattern images will be transcribed onto the wafer (ST100).

Then, the photolithography processing equipment is adjusted to align the wafer and the reticle using alignment marks formed on shots of the wafer and on the reticle or the like (ST102). Next, the pattern images defined on the reticle are exposed to light, whereby the images are transferred to the photoresist on the positioned wafer (ST104).

Next, it is necessary to measure certain results of the transcription process, such as the distances that the center of the wafer is misaligned in directions of an X axis and Y axis (wherein pattern images to be transcribed are offset with respect to those on shots of a pre-existing pattern layer), the amount of expansion or contraction from the center of the wafer, and the relative angular position. In other words, all of the parameters related to the misalignment of the wafer relative to the photoprocessing equipment are measured (ST106).

Then, a worker determines whether the measured data falls within a prescribed margin for error and whether the photolithography process will be performed again or is to continue on the same wafer (ST108).

At this time, if the data falls outside the margin for error, the process proceeds with a stripping step (ST110) in which the photoresist is stripped from the wafer, followed by a clean and dry step (ST112) in which remnants of the photoresist and the like are removed and the wafer is dried. From there, the wafer is re-positioned in the photolithography equipment and the last image transcription process begins over again. Also, the alignment position is corrected, i.e., the database is updated using the measured data, so that the next wafer or the wafer to be re-worked will be aligned properly (ST114). If the measured data falls within the prescribed margin for error, the process will proceed with a developing and cleaning step in which the pattern image transferred to the photoresist is developed and the wafer is cleaned (ST120), followed by a final step in which the wafer is unloaded (ST122).

However, in the above-described process, the step coverage of material on a pre-existing pattern layer of the wafer varies depending upon the fabrication processes that have been carried out. Furthermore, material deposited to form a metal layer, as shown in FIG. 2, flows in a direction from the center to the edge of the wafer. At this time, if the material is deposited closer to one edge of the wafer, more of the material will accumulate at an inner part of the alignment mark than on the outer part. Accordingly, the layer formed of the deposited material will be asymmetrical with reference to the actual (underlying) alignment mark.

Therefore, the wafer alignment position may be sensed radially inwardly of the actual alignment mark. In this case, it is falsely determined that the wafer has contracted. As a result, the database related to alignment position is re-configured such that the field of the pattern images to be subsequently transcribed is narrowed (magnification is increased). Accordingly, processing errors occur.

Furthermore, the measured data is used as a statistical, supplementary database for establishing the alignment position upon sensing the position of an alignment mark. As a result, the measured data remains un-discriminated from the error of misalignment due to the contraction or expansion of the wafer.

Still further, alignment marks on the wafer, above which different processing operations may be performed, may have various step heights (h, h') as shown in FIG. 3 or 4. The asymmetry in the layer deposited on the alignment mark varies in accordance with the step height. In general, the greater the step height, the greater the amount of offset (q, q') between the alignment mark position and the wafer alignment position (the position of the wafer sensed on the basis of the metal layer formed on the alignment mark). That is, the wafer becomes misaligned to a degree corresponding to the amount of asymmetry in the overlying metal layer.

A misalignment due to the asymmetry in a layer deposited over an alignment mark may cause even a wafer that has undergone a normal amount of expansion or contraction to be recognized as defective. In such cases, the photolithography process is re-worked over and over again because the database used for aligning the wafer is configured with incorrect data generated from the sensed position of the wafer. Hence, the efficiency and productivity of the manufacturing process are adversely affected.

SUMMARY OF THE INVENTION

It is an object of the present invention to solve the aforementioned problems of the prior art.

To achieve this object, the present invention provides a method of aligning transcribed images in photolithography, in which the alignment position data pertaining to the contraction or expansion of the wafer is corrected on the basis of the specifications of the wafer. In particular, the alignment position data pertaining to the contraction or expansion of the wafer is corrected on the basis of the step height of the alignment mark.

First, using alignment position data of a database, a wafer is aligned with a reticle bearing pattern images. Then the wafer is exposed to transcribe the pattern images onto the wafer. Measurements, including the amount of thermal expansion or contraction of the wafer, are taken to ascertain the degree to which the transcribed pattern images are aligned with pre-existing pattern images. These measurements are made by sensing the position of a stepped alignment mark on the wafer.

Next, the results of the measurements are used to update the alignment position data of said database. If the measurements are outside a prescribed margin for error, the wafer is re-aligned.

Also, in this case, the alignment position data of the database is corrected with a compensation value correlated to the height of the stepped alignment mark.

Preferably, the compensation values are derived from respective wafer groups and are stored in a separate database according to an expansion or contraction of the respective wafer groups.

Furthermore, the compensation values are preferably statistically estimated based on experimentally obtained data measuring the amount of expansion or contraction of wafers having a predetermined range of step coverages.

According to the present invention, the alignment of wafers in an on-going photolithography process is improved, and the number of times that a wafer is unnecessarily re-worked is reduced. Hence, the efficiency of the photolithography process is improved as are the quality and reliability of the final products.

BRIEF DESCRIPTION OF THE DRAWINGS

These and other objects, features and advantages of the invention will become more apparent from the following detailed description of the preferred embodiments thereof made with reference to the accompanying drawings, of which.

DETAILED DESCRIPTIONS OF THE PREFERRED EMBODIMENTS

Figure 1:
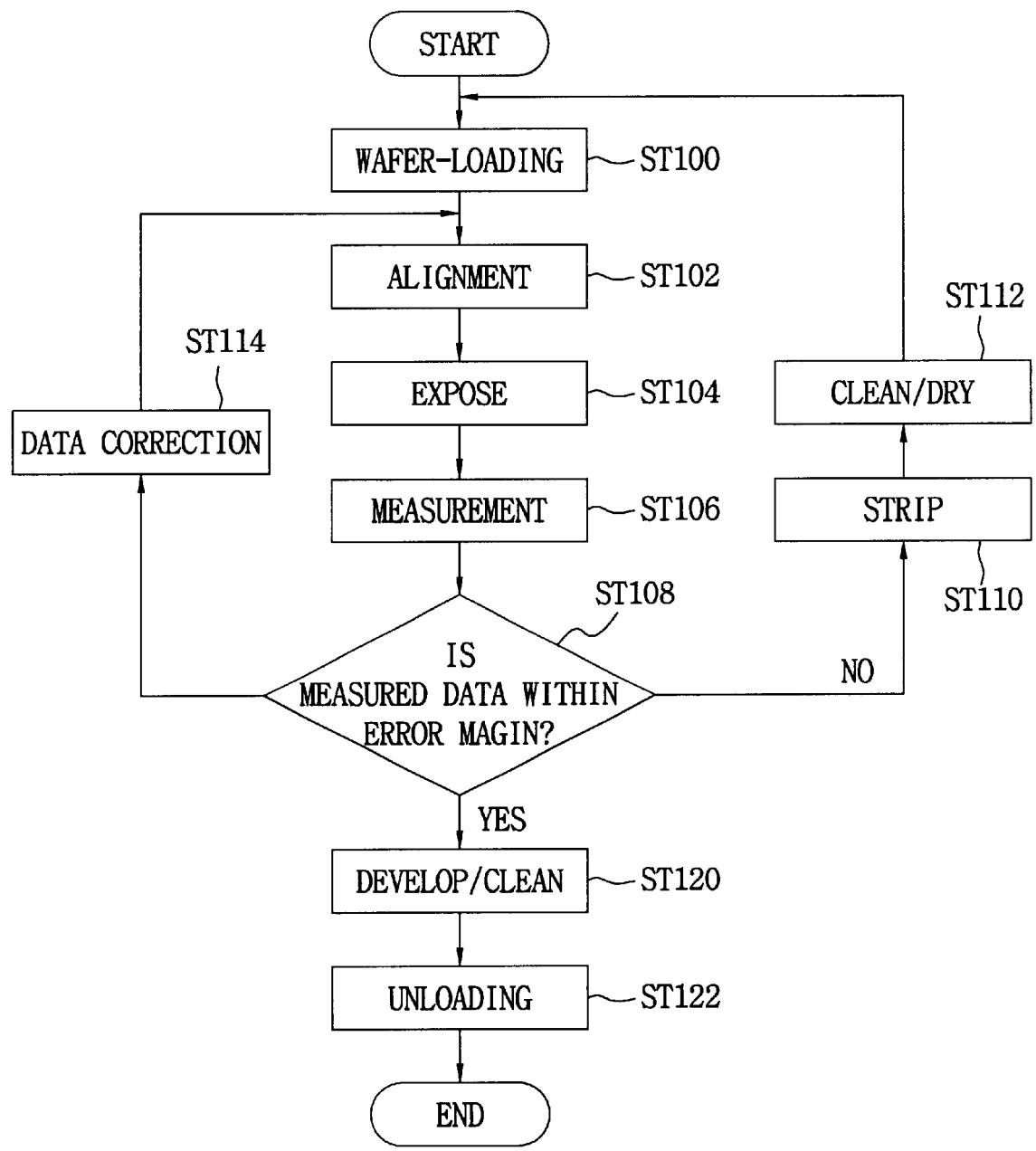
FIG. 1 is a flowchart of a conventional photolithography process.
Figure 2:
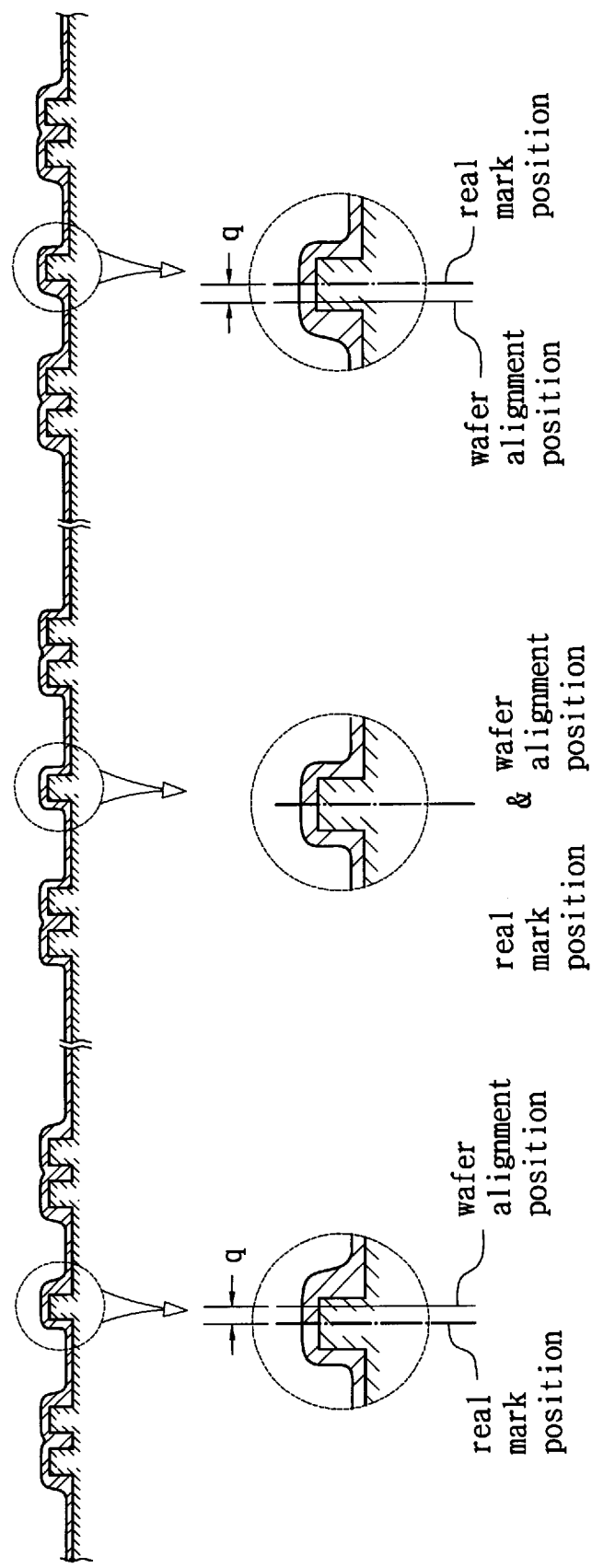
FIG. 2 is an enlarged, partial, cross-sectional view of a portion of a wafer at which an alignment mark is formed, illustrating the misalignment that may occur, in the process shown in FIG. 1, due to a normal thermal deformation (contraction) of the wafer.
Figure 3:
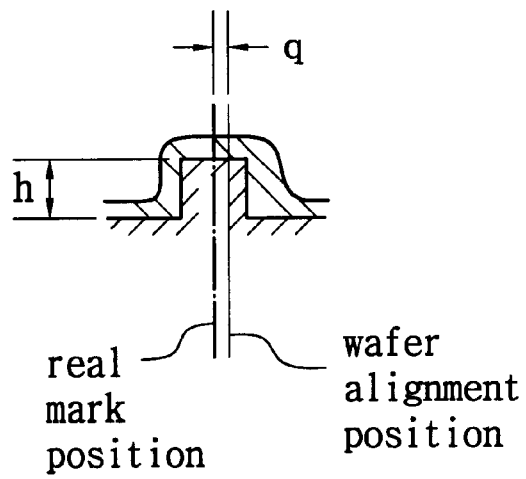
FIGS. 3 and 4 are cross-sectional views of alignment marks of different wafers, illustrating how different sensed alignment positions may be produced depending on the step height of the alignment mark.
Figure 4:
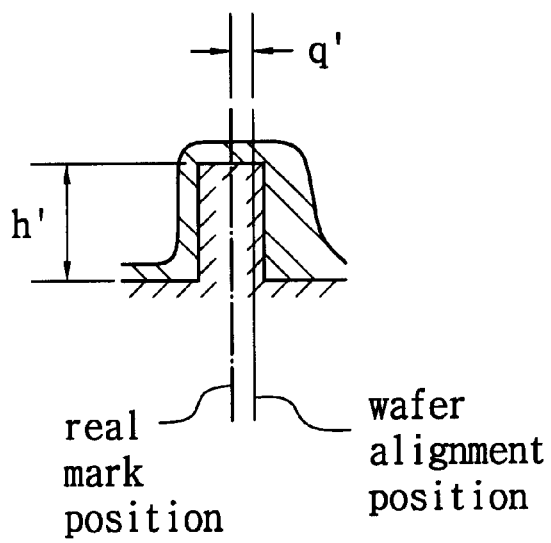
Figure 5:
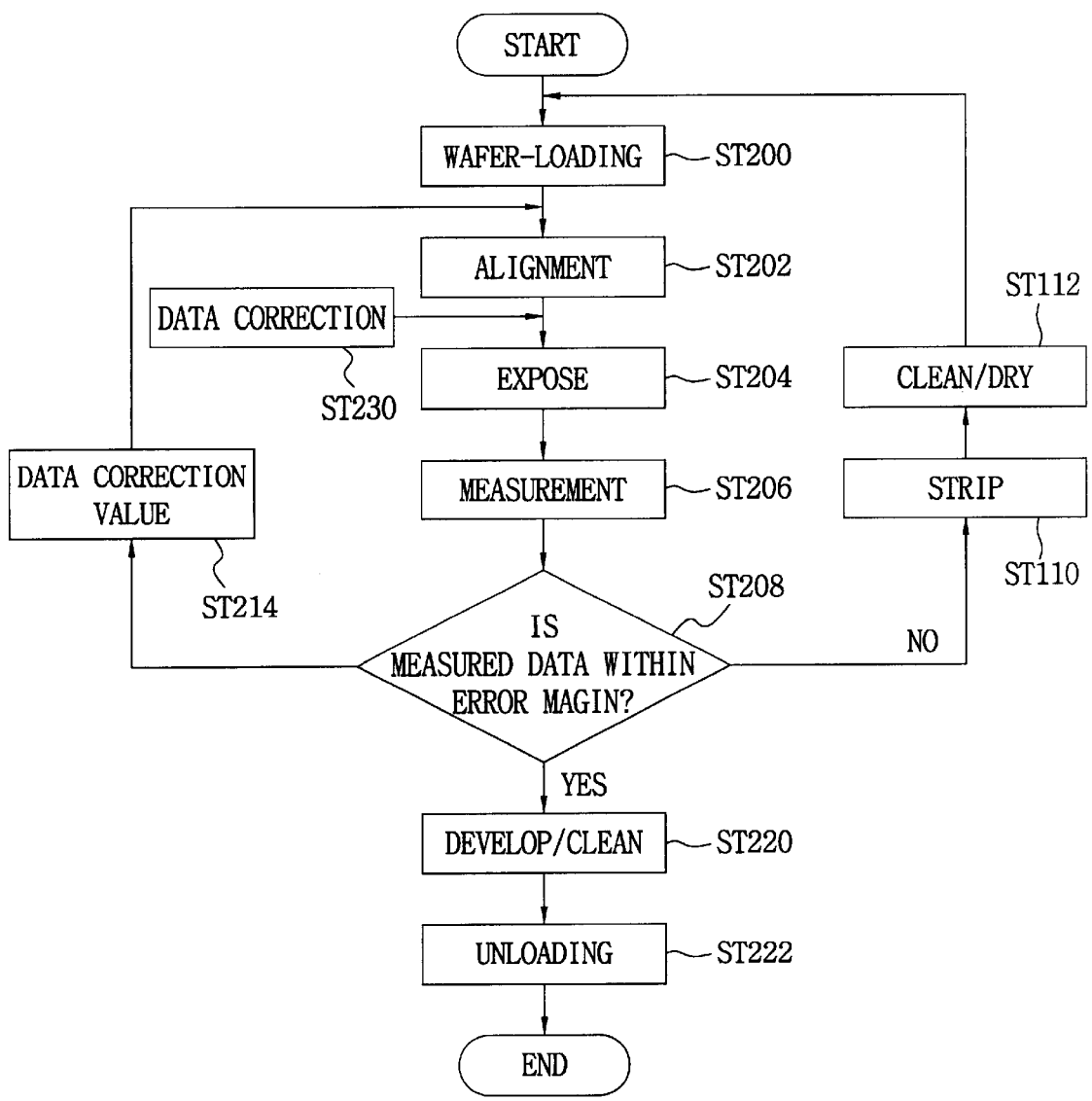
FIG. 5 is a flowchart of a photolithography process according to the present invention.

A method of aligning images in a photolithography process according to the present invention will now be described with reference to FIGS. 5 and 6.

The method according to the present invention begins by loading a wafer having a coating of photoresist into the photolithography equipment and positioning the coated wafer to face a reticle bearing the image that will be reproduced on the wafer (ST200), aligning the wafer and reticle using alignment marks formed on respective parts thereof (ST202), and then exposing the wafer whereupon pattern images of the reticle are transcribed onto the wafer (ST204).

Next, certain measurements are made to determine the state of alignment of pattern images that have been sequentially transcribed onto the wafer (ST206). That is, in this step, the currently transcribed pattern images are compared with the pre-existing ones on respective shots of the wafer. Specifically, the misalignment of the images in the direction of the X axis and Y axis, and relative rotational position, as well as an expansion or contraction of the field of the image with respect to the pre-existing pattern layer formed on the wafer, are measured.

Then, a worker determines whether the measured data falls within a prescribed margin for error and whether the photolithography process will be re-worked or the next processes will be performed on the wafer (ST208). That is, at this time, if the measured data falls outside the margin of error, the process will proceed with the re-working of the wafer. For instance, a stripping step will be performed (ST210) to remove the photoresist from the surface of the wafer followed by a rinsing and drying step (ST212). Finally, the wafer will be moved to a position for re-loading (ST200). On the other hand, if the measured data falls within the prescribed margin for error, the process proceeds with the developing of the transcribed pattern images and cleaning of the wafer (ST220). Finally, the wafer is unloaded (ST222).

Also, according to the present invention, the alignment data used to position the next wafer or the wafer to be re-worked is corrected (ST214) using the measured data. That is, an alignment correction value from the database is used to adjust the photoprocessing equipment to compensate for an alignment error measured between the transcribed pattern images and the pre-existing pattern layer. In this case, the alignment correction value will take into account the measured expansion or contraction of the wafer. However, in this step, as in the prior art, there is no input regarding the effect that the step height of a pattern layer may have on the measurement of the expansion/contraction.

Accordingly, the present invention includes steps of providing a compensation value that accounts for the amount of asymmetry produced between the alignment mark and the overlying pattern layer when the wafer undergoes expansion or contraction, and adding the compensation value to the alignment position data in providing the alignment correction value related to the thermal expansion or contraction of the wafer (ST230). These steps will be described in more detail in the following.

The compensation values are acquired through repeated experiments in which wafers having alignment marks of various step heights covered with a pattern (conformal) layer were caused to undergo normal thermal expansion and contraction. The results of these experiments are shown in FIG. 6. In FIG. 6, each point represents a group of wafers having alignment marks of the same height. The expansion/contraction coefficient is a measure of the difference between the sensed position of the mark from a reference position. Thus, FIG. 6 can be used to form a database of compensation values that correlate the step height of an alignment mark to the asymmetry between the real mark position and the sensed mark position that occurs as the result of thermal expansion or contraction of the wafer.

Figure 6:
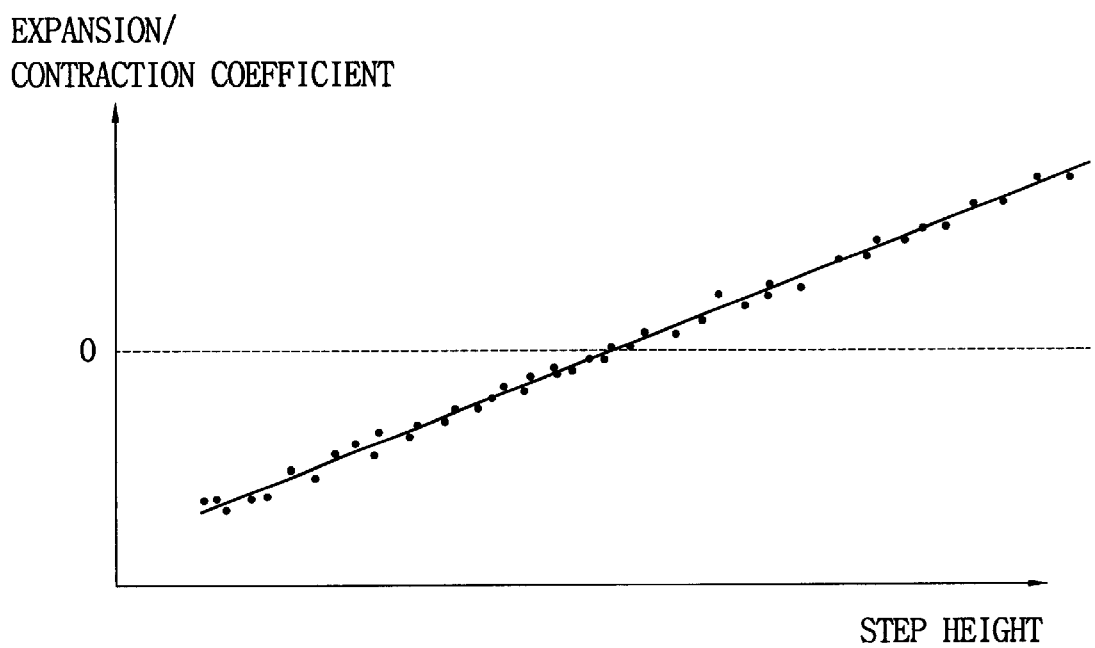
FIG. 6 is a graph of a database correlating step heights of pattern layers on wafers to expansion/contraction coefficients.

In summary then, using the known step height of the alignment mark on the wafer or group of wafers being aligned for photo-exposure, the alignment of the wafer is corrected using the data in the graph of FIG. 6 (expansion/contraction coefficient) to compensate for the asymmetry that occurs in the pattern layer on the alignment mark when the wafer undergoes thermal expansion or contraction. Accordingly, the initial alignment of the wafer is carried out with a high degree of precision. Also, when the photolithography process must be re-worked, the re-alignment of the wafer is also carried out with the same high degree of precision.

As described above, the method of aligning a wafer for a photolithography process in accordance with the present invention is characterized in that compensation data is established which correlates a sensed amount of contraction or expansion of a wafer to the step coverage height of an alignment mark. This correlation is a measure of the asymmetry that produces a discrepancy between the real mark position and the sensed mark position. This discrepancy is effectively compensated for in the alignment position database. Accordingly, the effectiveness and reliability of the alignment position database is increased, whereby the time necessary to complete the photolithography process is reduced and the quality and reliability of the final product are improved.

Although the present invention has been described with reference to a preferred embodiment thereof, various changes and modifications can be made thereto without departing from the true spirit and scope of the invention as defined by the appended claims.

What is claimed is:

1. In a photolithography process, a method for use in ensuring that images transcribed onto a wafer will be aligned relative to one another, comprising:
   (a) using a database of alignment position data, aligning the wafer with a reticle bearing pattern images to be transcribed onto the wafer;
   (b) exposing the wafer to transcribe the pattern images onto the wafer;
   (c) taking measurements indicative of the degree to which the transcribed pattern images are aligned with pre-existing pattern images, including sensing the position of a stepped alignment mark on the wafer;
   (d) producing a data correction value based on the measurements, and using the data correction value to update the alignment position data of said database; and
   (e) subsequently correcting the alignment position data of the database with a compensation value correlated to the height of said stepped alignment mark.

2. The method as claimed in claim 1, wherein when the measurements are outside a predetermined margin for error, the wafer is re-aligned using the alignment position data corrected with the compensation value.

3. The method as claimed in claim 1, wherein (e) comprises developing a database of compensation values experimentally using wafers having alignment marks of different step heights, and selecting from the database of compensation values the compensation value relevant to the step height of the alignment mark on the wafer that is being aligned.

4. The method as claimed in claim 3, wherein the compensation values are stored in a database separate from the database of the alignment position data.

5. The method as defined in claim 3, wherein the compensation values are statistically estimated.

6. The new method as claimed in claim 1, wherein (c) comprises determining any misalignment of the transcribed pattern images in X-axis and Y-axis directions lying extending orthogonally to one another in the plane of the wafer.

7. In a photolithography process, a method for use in ensuring that images transcribed onto a wafer will be aligned relative to one another, comprising:
   (a) using a database of alignment position data, aligning the wafer with a reticle bearing pattern images to be transcribed onto the wafer;
   (b) exposing the wafer to transcribe the pattern images onto the wafer within a field in which pre-existing pattern images have already been formed, whereby the transcribed pattern images lie over the pre-existing pattern images within said field;
   (c) taking measurements indicative of the degree to which the transcribed pattern images are aligned with pre-existing pattern images within said field, including sensing the position of a stepped alignment mark on the wafer;
   (d) producing a data correction value based on the measurements, and using the data correction value to update the alignment position data of said database; and
   (e) subsequently correcting the alignment position data of the database with a compensation value correlated to the height of said stepped alignment mark.

8. The method as claimed in claim 7, wherein when the measurements are outside a predetermined margin for error, the wafer is re-aligned using the alignment position data corrected with the compensation value.

9. The method as claimed in claim 7, wherein (e) comprises developing a database of compensation values experimentally using wafers having alignment marks of different step heights, and selecting from the database of compensation values the compensation value relevant to the step height of the alignment mark on the wafer that is being aligned.

10. The method as claimed in claim 9, wherein the compensation values are stored in a database separate from the database of the alignment position data.

11. The method as defined in claim 9, wherein the compensation values are statistically estimated.

12. The method as claimed in claim 1, wherein (c) comprises determining any misalignment of the transcribed pattern images in X-axis and Y-axis directions lying extending orthogonally to one another in the plane of the wafer.

* * * * *